(12) United States Patent
Laurent

(10) Patent No.: US 6,738,431 B1
(45) Date of Patent: May 18, 2004

(54) METHOD FOR NEUTRALIZING A TRANSMITTER TUBE

(75) Inventor: Pierre André Laurent, Bessancourt (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/674,011

(22) PCT Filed: Apr. 16, 2000

(86) PCT No.: PCT/FR99/00901

§ 371 (c)(1),
(2), (4) Date: Oct. 24, 2000

(87) PCT Pub. No.: WO99/56400

PCT Pub. Date: Nov. 4, 1999

(30) Foreign Application Priority Data

Apr. 24, 1998 (FR) .......................................... 98 05180

(51) Int. Cl.[7] .................................................. H04K 1/02
(52) U.S. Cl. ....................................... 375/296; 375/302
(58) Field of Search ................................ 375/295, 296, 375/297, 302; 348/325, 326, 330, 377, 378, 379, 380

(56) References Cited

U.S. PATENT DOCUMENTS 3,931,466 A * 1/1976 Van Den Berg ............ 348/326
4,027,261 A    5/1977 Laurent et al.
4,382,232 A    5/1983 Laurent
4,603,393 A    7/1986 Laurent et al.
4,799,241 A    1/1989 Laurent
4,852,098 A    7/1989 Brechard et al.
4,888,778 A   12/1989 Brechard et al.
4,905,256 A    2/1990 Laurent
4,945,312 A    7/1990 Auger et al.
4,982,341 A    1/1991 Laurent
5,016,278 A    5/1991 Rochette et al.
5,243,685 A    9/1993 Laurent
5,313,553 A    5/1994 Laurent
5,522,009 A    5/1996 Laurent
6,016,469 A    1/2000 Laurent

* cited by examiner

Primary Examiner—Don N. Vo
(74) Attorney, Agent, or Firm—Oblon, Spivak, McClelland, Maier & Neustadt, P.C.

(57) ABSTRACT

A process for neutralizing a tube of a high power digital radio broadcasting transmitter includes modulating two quadrature signals $I(t)$, $Q(t)$ at a transmission frequency $(F_0)$ by a modulator to control a grid of the tube which is configured to work at saturation with a gain $V_2$. A phase-modulated input signal $E(t)$ output from the modulator is amplified by an amplifier which is configured to work at saturation with a gain $V_1$. The input signal $E(t)$ is predistorted by digital means so as to compensate for an undesirable coupling between an anode and the grid of the tube of the transmitter so that an output of the transmitter corresponds to a desired output signal $S(t)$. A corrector signal $W(t)$ is calculated using the expression $W(t)=jg(t)S(t)$.

4 Claims, 3 Drawing Sheets

METHOD FOR NEUTRALIZING A TRANSMITTER TUBE

BACKGROUND OF THE INVENTION

1. Field of the Invention

The present invention relates to a process for neutralizing the tube of a radio broadcasting transmitter of high power digital type and a radio broadcasting transmitter implementing this process.

2. Discussion of the Background

The radio broadcasting transmitters currently used at short wavelengths are optimized so as to have very high efficiency when transmitting under pure amplitude modulation with carrier residual.

This optimization is achieved in particular by using a transmission tube of high power acting essentially as a switch controlled in tempo with the carrier wave to be transmitted. The transmission tube acts on a high-voltage signal which is provided by a modulator whose structure is tailored to the modulation used (PWM modulations, the abbreviation standing for "pulse width modulation" for example) and which is proportional to the instantaneous amplitude of the HF signal. The new radio broadcasting systems undergoing standardization are of digital type so that the form of the wave which they transmit has no immediate relationship with that of the audio frequency signal.

The use, in these radio broadcasting systems, of the same tubes as before associated with one or more modulators, whilst also wishing to transmit such a waveform demands, on the one hand, that the reference carrier be phase-modulated and, on the other hand, that the neutralization of the tube be carried out very well. In view of the geometrical constraints generally imposed on the construction of the final stage of the amplifiers, the neutralization performed according to present-day methods, which rely on analog compensation circuits, cannot be totally effective.

The aim of the invention is to propose a process tailored to a digital-type radio broadcasting system for remedying the aforesaid drawback.

SUMMARY OF THE INVENTION

For this purpose, the subject of the invention is a process for neutralizing the tube of a radio broadcasting transmitter, of high power digital type, comprising an amplifier working at saturation with a gain $V_1$ and amplifying a phase-modulated input signal emanating from a modulator modulating at a transmission frequency two quadrature signals so as to control the grid of the tube, the latter working at saturation with a gain $V_2$, characterized in that it consists in pre-distorting the input signal by digital means so as to compensate for the undesirable coupling between the anode and the grid of the tube of the transmitter in such a way that the output of the transmitter corresponds to a desired output signal.

The subject of the invention is also a radio broadcasting transmitter implementing the aforesaid process.

The advantage of the invention is that the compensation for the interference between the anode and the grid is carried out in a digital manner. This characteristic makes it possible to circumvent geometrical constraints which generally accompany the design of the final amplifying stage. The digital nature also allows fully tailored, flexible and upgradable compensation which requires no unwieldy modification of the transmitter.

According to a preferred mode of implementation of the process, the determination of the transfer function H(t) of the anode/grid coupling is carried out at regular instants. This mode makes it possible to obtain neutralization which takes into account the drift phenomena (due for example to aging, to heat) which are manifested in particular by phase rotations.

BRIEF DESCRIPTION OF THE DRAWINGS

Other characteristics and advantages of the invention will become apparent from the description which follows in conjunction with the appended drawings which represent.

DESCRIPTION OF THE EMBODIMENTS

Figure 1A:
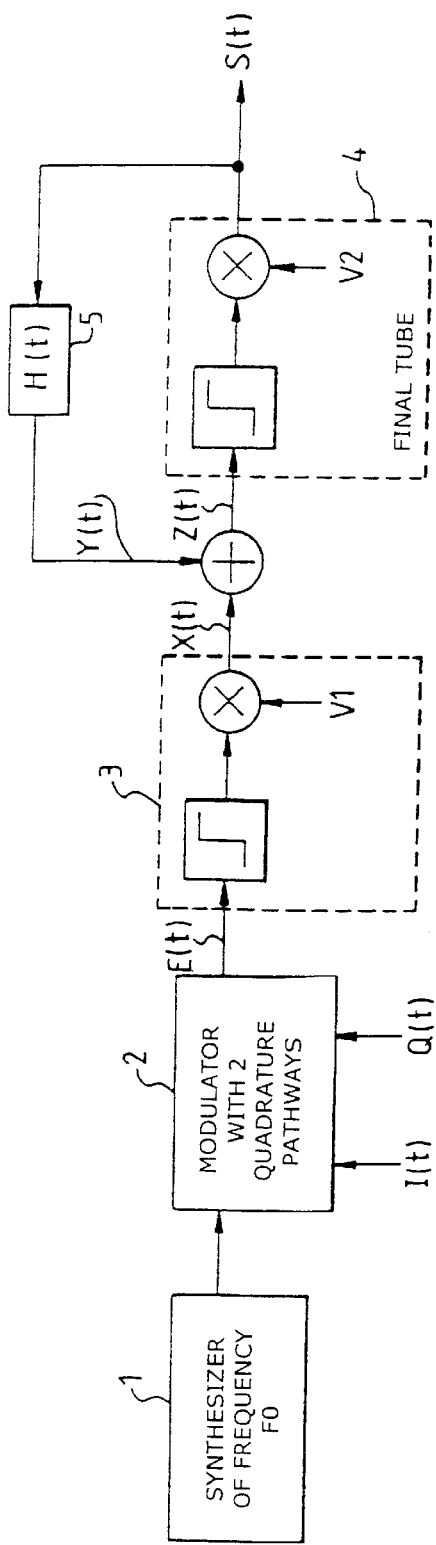
FIG. 1A, a modeling of an elementary transmitter.

A modeling of an elementary transmitter is represented in FIG. 1A. The transmitter comprises a synthesizer 1, a modulator 2, an amplifier stage 3 referred to as the "driver" and an output tube 4. The representation depicts the coupling 5 existing between the anode and the grid of the tube.

The synthesizer 1 generates a sinusoidal so-called "reference" signal at a transmission frequency $F_0$ which is also referred to as the carrier frequency.

The modulator 2 has two quadrature pathways, one corresponding to the input signal I(t) and the other to the input signal Q(t). It generates an output signal E(t) which is a modulation at the frequency $F_0$ of the reference signal generated by the synthesizer 1. It is expressed in the form:

$$E(t)=I(t)\cos 2\pi F_0(t)+Q(t)\sin 2\pi F_0(t) \tag{1}$$

The modulated signal E(t) is amplified by the amplifier stage 3, having a power of a few kW, which is modeled in the form of a hard limiter followed by a multiplier of fixed gain $V_1$. The term "hard limiter" denotes a device which does not modify the phase of the input signal and which delivers an output signal with a constant amplitude.

The amplified signal X(t) consequently retains the phase Φ of the modulated signal E(t) but exhibits an amplitude $V_1$, taking the amplitude of the modulated signal E(t) as reference.

Figure 1B:
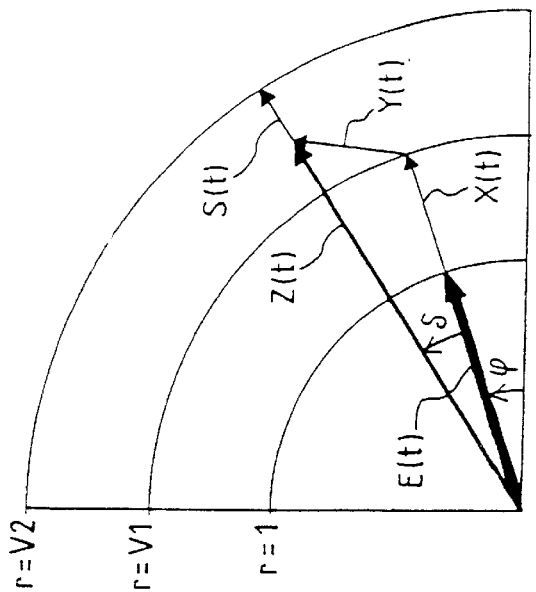
FIG. 1B, a representation in the complex plane of signals involved in the elementary transmitter of FIG. 1A, FIG. 2A, a modeling of a transmitter implementing the process according to the invention, FIG. 2B, a representation in the complex plane of signals involved in the transmitter of FIG. 2A, FIG. 3, a transmitter implementing the process according to the invention and equipped with a calibration system.

FIG. 1B gives a diagrammatic representation in the complex plane of the signals involved, considering their relative amplitude and their relative phase. The signal E(t) is represented with an amplitude of 1; the signal X(t) therefore has an amplitude VI. The grid of the output tube 4, this grid being regarded as the tube input, sees the amplified signal X(t) to which is added a fraction Y(t) of the output signal S(t) taken on the anode of the tube. The fraction Y(t) is due to the coupling 5 between the anode and the grid of the tube which is induced by the stray capacitance existing between the grid and the anode. Letting H(t) denote the transfer function of the coupling 5 between the anode and the grid, the fraction Y(t) is the result of convolving the output signal S(t) with the transfer function H(t). Namely the following expression:

$$Y(t)=S(t)*H(t) \tag{2}$$

The result of the addition corresponds to the signal Z(t) which is "seen" by the tube input:

$$Z(t)=X(t)+S(t)*H(t) \quad (3)$$

Figure 2B:
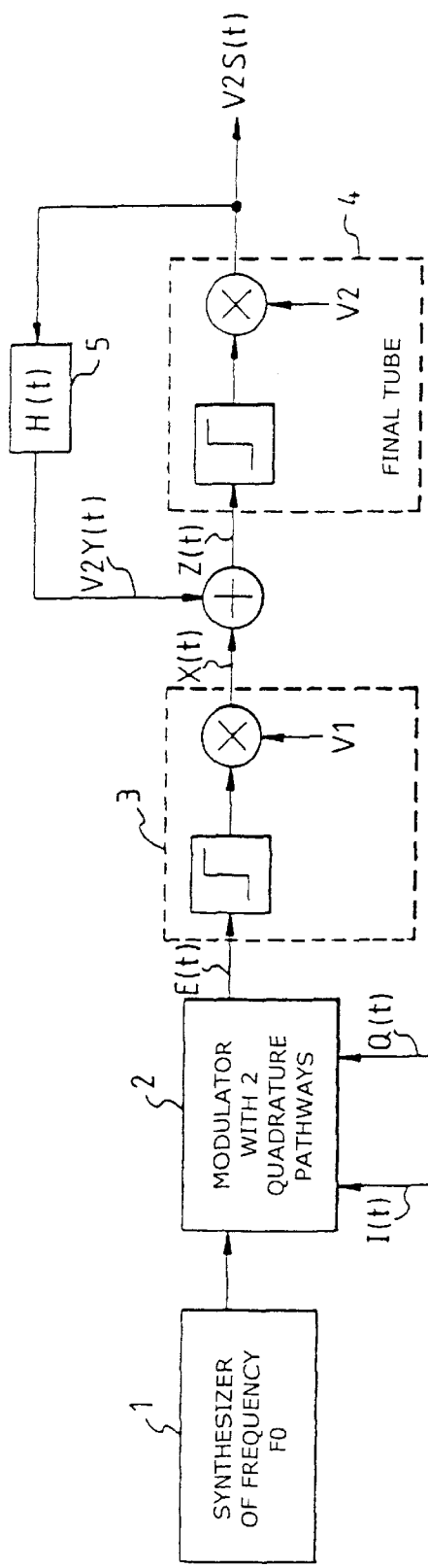
Figure 2B:
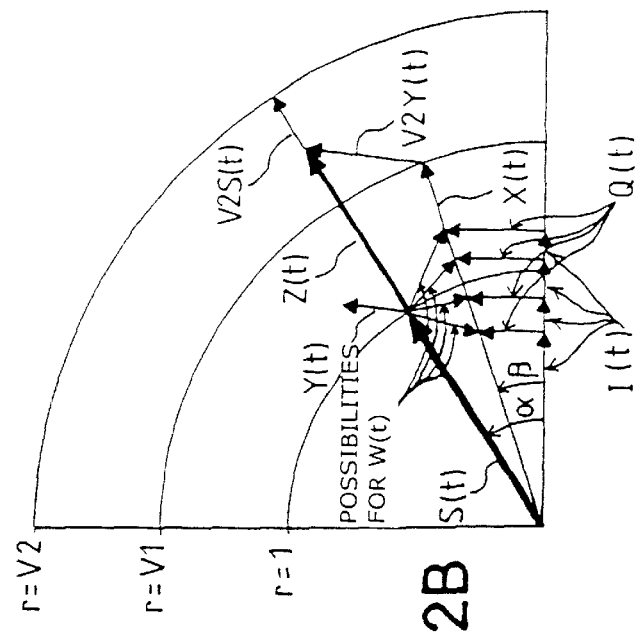
Figure 2A:
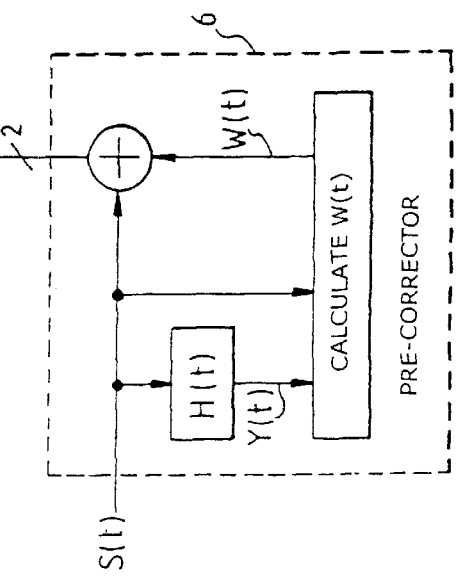

The output tube 4 is biased in such a way as to work at saturation. It is consequently modeled by a hard limiter followed by a multiplier of fixed gain $V_2$. Consequently, the signal S(t) is represented with an amplitude $V_2$ and an identical phase to that of the tube input signal Z(t). To remedy the phase distortion δ introduced by the transfer function H(t) of the coupling 5, the amplified signal X(t) is pre-distorted in such a way that the transmitter output signal S(t) corresponds to a desired signal to be transmitted. The means employed for carrying out this pre-distortion are represented diagrammatically in FIG. 2A. The signals corresponding to the device of FIG. 2A are represented in FIG. 2B, considering their relative amplitude and their relative phase. The transmitter represented is equipped with means 6 enabling it to implement the process according to the invention.

The means 6 consist of a pre-correction system essentially comprising a signal processor. Knowing the coupling 5 with transfer function H(t), the pre-correction system 6 calculates a corrector signal W(t) and adds it to the desired output signal S(t) so that the signals which it generates I(t) and Q(t) satisfy the relation:

$$I(t)+jQ(t)=S(t)+W(t) \quad (4)$$

The desired output signal S(t) is characterized by its phase α given in the complex plane with respect to the quadrature signals I(t) and Q(t). The signal (t) is chosen so as to represent the real axis and Q(t) the imaginary axis. As shown by the representation, there is an infinity of possible values for the correction signal W(t) to which there corresponds an infinity of values for the signals I(t) and Q(t); the signals W(t), I(t) and Q(t) having to satisfy relation (4).

The signal S(t) taken as reference by the pre-correction system is chosen in such a way that its modulus is equal to unity. The output signal $V_2S(t)$ has amplitude $V_2$ and has the same phase α as the signal S(t). This is because the pre-distortion carried out by the pre-correction system 6 introduces a phase rotation in such a way that the amplified signal X(t) exhibits a phase β and an amplitude $V_1$. The coupling 5 with transfer function H(t) has a phase rotation effect which opposes the pre-distortion introduced by the pre-correction system 6. The phase rotation is introduced by adding the fraction $V_2Y(t)$ of the output signal $V_2S(t)$ to the amplified signal X(t).

According to a preferred mode of carrying out the process, the correction signal W(t) is calculated so as to be in quadrature with the signal S(t) The correction signal may be written in the form:

$$W(t)=jg(t)S(t) \quad (5)$$

where g(t) is a time-dependent gain.

Given the various relations which link the signals represented in FIG. 2B, we obtain the following expression for g(t):

$$g(t) = \frac{\frac{V2}{V1}\text{Im}[S(t)Y*(t)]}{\sqrt{1 - \frac{V2}{V1}\text{Im}[S(t)Y*(t)]^2}} \quad (6)$$

in which Im(SIGNAL) represents the imaginary part of SIGNAL and SIGNAL* represents the conjugate of SIGNAL.

According to expression (6), g(t) is zero when the imaginary part of S(t)Y*(t) is zero. This is because this corresponds to the case where Y(t) is colinear with S(t), and consequently with X(t), and therefore introduces no phase distortion.

A simple example makes it possible to illustrate the above preferred mode. In this example, the anode/grid coupling is of the resistance/capacitance type with a transfer function H(t) represented by its Laplace transform H(p):

$$H(p) = \frac{\tau p}{1 + \tau p} \quad (7)$$

with τ a small time constant of between 10 and 100 ns.

The pre-correction system is digital. It works on signals sampled at a sampling period T. The expression for the transfer function H(t) to be taken into account is consequently H(z), the sampled version of H(p).

H(z) is obtained by replacing in H(p), p by:

$$\frac{2}{T}\frac{1-z^{-1}}{1+z^{-1}} \quad (8).$$

Considering that the carrier frequency is $F_0$ and that $\omega_0=2\pi F_0$, it follows that:

$$H(z) = G\frac{1 + Az^{-1}}{1 + Bz^{-1}} \quad (9)$$

with $$G = \frac{2 + j\omega_0 T}{2 + j\omega_0 T + \frac{T}{\tau}}, \quad A = \frac{j\omega_0 T - 2}{j\omega_0 T + 2}, \quad B = \frac{j\omega_0 T + \frac{T}{\tau} - 2}{j\omega_0 T + \frac{T}{\tau} + 2}.$$

The $n^{th}$ sample of the signal Y(t), the result of convolving S(t) with H(t), is calculated with the following recursion formula:

$$Y(nT)=G[S(nt)+AS((n-1)T)-BY((n-1)T)] \quad (10)$$

Knowing Y(nT), it is possible to determine g(t) at the instant t=nT by using relation (6) and then to deduce W(t) from it at the same instant by applying relation (5). Finally, I(t) and Q(t) are determined for the instant t=nT by applying relation (4). Namely:

$$I(nT)+jQ(nT)=S(nT)(1+jg(nT)) \quad (11)$$

The system can carry out a more complex correction. To do this, it is sufficient to take into account a more elaborate transfer function H(t) of the anode/grid coupling. The transfer function H(p) can be chosen to be of a higher order, for example order two. The sampled version H(z) of H(p) can then be expressed in the form:

$$H(z) = G \frac{1+A_1z^{-1}}{1+B_1z^{-1}} \frac{1+A_2z^{-1}}{1+B_2z^{-1}} \quad (12)$$

or in the form:

$$H(z) = G \frac{1+A_1z^{-1}+A_2z^{-2}}{1+B_1z^{-1}+B_2z^{-2}} \quad (13)$$

Figure 3:
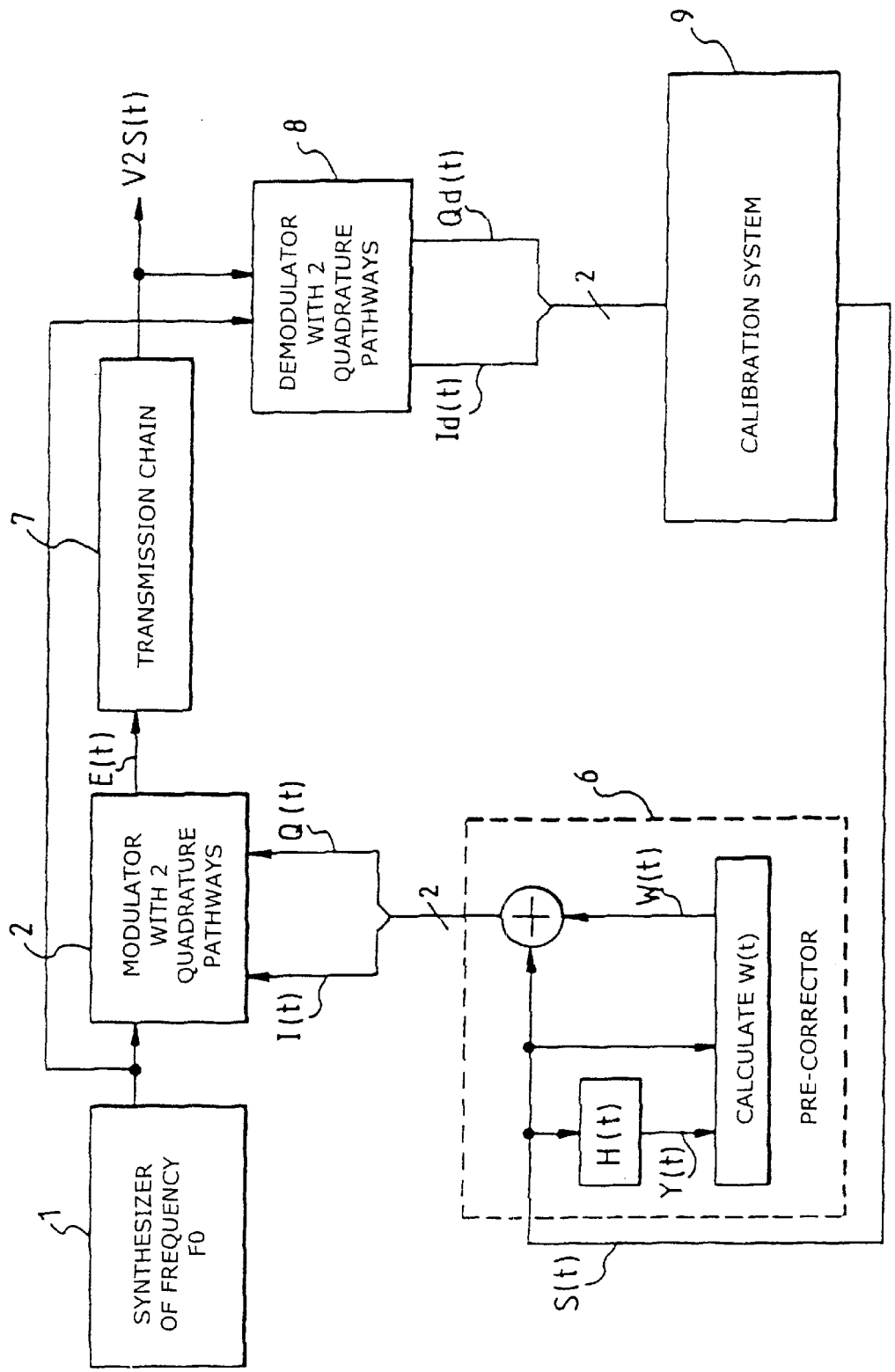

The transfer function H(t) of the anode/grid coupling may be assumed to be known, being as it is a characteristic of the transmitter. Otherwise, it can be determined by a calibration system associated with a demodulator. FIG. 3 represents a transmitter implementing the process according to the invention and equipped with a system for evaluating the transfer function of the anode/grid coupling. By comparison with FIG. 2A, the previous representation of the transmitter, the amplifier and the final tube have been grouped together in the transmission chain 7. The input E(t) of the transmission chain 7 corresponds to the input of the amplifier 3, the so-called "driver", and the output $V_2S(t)$ of the transmission chain 7 corresponds to the output of the final tube 4.

The system for evaluating the transfer function of the anode/grid coupling comprises a demodulator 8 having two quadrature pathways and a calibration system 9.

The demodulator 8 demodulates the output signal $V_2S(t)$ actually transmitted by demodulating by means of the frequency $F_0$ having served for the modulation. The demodulated signal is represented by two quadrature signals Id(t) and Qd(t).

The function of the calibration system (9) is to adjust the coefficients G, $A_i$, $B_i$ of the transfer function H(z). This adjustment can be carried out according to the following procedure:

in an initial step, the coefficients G, $A_i$, $B_i$ are initialized to zero, in a second step, the transmission frequency $F_0$ is fixed at a given value lying within the chosen transmission channel, in a third step, the coefficients G, $A_i$, $B_i$ are calculated using relation (9), in a fourth step, the coefficients G, $A_i$, $B_i$ are modified n−1 times and only those which make it possible to minimize the phase deviation between the demodulated signal Id+jQd and the expected signal S(t) are kept.

For example, for values $G_0$, $A_0$, $B_0$ determined in the third step, n−1 other values are tested for each coefficient. Namely overall n×n×n=125 sets of values in the case where n=5 for example.

For example, for G, the tested values may be given by: $G_0/G_0+\epsilon/G_0-\epsilon/G_0+j\epsilon$ and $G_0-j\epsilon$ with $\epsilon$ a small constant. The procedure of the above steps may be repeated with other frequencies of the relevant channel until the phase deviation can no longer be reduced.

The transfer function of the anode/grid coupling can be evaluated when the transmitter is commissioned, that is to say, once and for all.

Given the digital nature of the evaluation, it would appear to be more effective to carry out this evaluation regularly. For example, each time the transmitter is switched on or else after each transmission.

What is claimed is:

1. A process for neutralizing a tube of a high power digital radio broadcasting transmitter, the process comprising:

modulating two quadrature signals I(t), Q(t) at a transmission frequency ($F_0$) by a modulator to control a grid of the tube which is configured to work at saturation with a gain $V_2$;

amplifying by an amplifier a phase-modulated input signal E(t) output from the modulator, the amplifier being configured to work at saturation with a gain $V_1$;

predistorting the input signal E(t) by digital means so as to compensate for an undesirable coupling between an anode and the grid of the tube of the transmitter so that an output of the transmitter corresponds to a desired output signal S(t);

determining a transfer function H(t) of the anode/grid coupling;

calculating a corrector signal W(t) using the expression $$W(t) = jg(t)S(t)$$

$$g(t) = \frac{\frac{V2}{V1}\text{Im}(S(t) \cdot Y*(t))}{\sqrt{1 - \left[\frac{V2}{V1}\text{Im}(S(t) \cdot Y*(t))\right]^2}}$$

where Im(SIGNAL) is the imaginary part of SIGNAL,

Y(t) is equal to S(t)*H(t), with * being the convolution product and Y(t) being a signal arising from the anode/grid coupling and being fed back to the grid, and SIGNAL* is the conjugate of the SIGNAL; and determining the quadrature signals I(t) and Q(t) to obtain the predistorted input signal E(t) by applying the relation $$I(t)+jQ(t)=S(t)+W(t).$$

2. The process according to claim 1, wherein the transfer function H(t) of the anode/grid coupling is regularly determined by an evaluation system which measures a phase deviation between a demodulated output signal ($V_2S(t)$) and the desired signal S(t) so as to adjust the transfer function H(t) to minimize the phase deviation.

3. A high power digital radio broadcasting transmitter, for implementing the process as claimed in claim 1, comprising:

a frequency synthesizer;

a modulator having two quadrature pathways;

an amplifier;

a final tube; and a pre-correction system configured to calculate a corrector signal W(t) by using the expression $$W(t)=jg(t)S(t)$$

$$g(t) = \frac{\frac{V2}{V1}\text{Im}(S(t) \cdot Y*(t))}{\sqrt{1 - \left[\frac{V2}{V1}\text{Im}(S(t) \cdot Y*(t))\right]^2}}$$

where Im(SIGNAL) is the imaginary part of SIGNAL,

Y(t) is equal to S(t)*H(t), with * being the convolution product and Y(t) being a signal arising from the anode/grid coupling and being fed back to the grid, and SIGNAL* is the conjugate of the SIGNAL and two quadrature signals I(t) and Q(t) are determined by the relation I(t)+jQ(t)=S(t)+W(t), wherein the modulator modulates the quadrature signals I(t) and Q(t) so as to generate a modulated signal E(t) which is amplified by the amplifier so as to drive the grid of the final tube.

4. The radio broadcasting transmitter according to claim 3, further comprising a system configured to evaluate the transfer function H(t) of the anode/grid coupling, the system comprising:

a demodulator having two quadrature pathways (Id(t), Qd(t)) having output signals obtained by demodulation with respect to the transmission frequency ($F_o$) of the output signal ($V_2S(t)$) transmitted; and a calibration system configured to adjust the transfer function (H(t)) by minimizing a phase deviation between a complex signal formed by the output signals of the demodulator and the desired signal (S(t)).

* * * * *

UNITED STATES PATENT AND TRADEMARK OFFICE
CERTIFICATE OF CORRECTION

PATENT NO. : 6,738,431 B1
DATED : May 18, 2004
INVENTOR(S) : Laurent

It is certified that error appears in the above-identified patent and that said Letters Patent is hereby corrected as shown below:

<u>Title page,</u>
Item [22], PCT Filing Date, should read:
-- [22]  PCT Filed: Apr. 16, 1999 --
Item [56], References Cited, should read:
-- [56] References Cited
    U.S. PATENT DOCUMENTS 3,931,466 A * 1/1976 Van Den Berg ............ 348/326
    4,027,261 A * 5/1977 Laurent et al.
    4,382,232 A * 5/1983 Laurent
    4,603,393 A * 7/1986 Laurent et al.
    4,799,241 A * 1/1989 Laurent
    4,852,098 A * 7/1989 Brechard et al.
    4,888,778 A * 12/1989 Brechard et al.
    4,905,256 A * 2/1990 Laurent
    4,945,312 A * 7/1990 Auger et al.
    4,982,341 A * 1/1991 Laurent
    5,016,278 A * 5/1991 Rochette et al.
    5,243,685 A * 9/1993 Laurent
    5,313,553 A * 5/1994 Laurent
    5,522,009 A * 5/1996 Laurent
    6,016,469 A * 1/2000 Laurent

UNITED STATES PATENT AND TRADEMARK OFFICE
CERTIFICATE OF CORRECTION

PATENT NO. : 6,738,431 B1
DATED : May 18, 2004
INVENTOR(S) : Laurent

It is certified that error appears in the above-identified patent and that said Letters Patent is hereby corrected as shown below:

<u>Title page (cont'd),</u>
FOREIGN PATENT DOCUMENTS

| EP | 658 975 A1 | 6/1995 |
| FR | 2 652 470 A1 | 3/1991 |
| EP | 907 276 A1 | 4/1999 -- |

Signed and Sealed this

Twenty-seventh Day of July, 2004

JON W. DUDAS
*Acting Director of the United States Patent and Trademark Office*